(12) United States Patent
Nagano et al.

(10) Patent No.: US 6,528,327 B2
(45) Date of Patent: Mar. 4, 2003

(54) METHOD FOR FABRICATING SEMICONDUCTOR MEMORY DEVICE HAVING A CAPACITOR

(75) Inventors: Yoshihisa Nagano, Suita (JP); Toru Nasu, Kyoto (JP); Hajime Yasuoka, Takatsuki (JP); Eiji Fujii, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/922,782

(22) Filed: Aug. 7, 2001

(65) Prior Publication Data

US 2002/0024079 A1 Feb. 28, 2002

(30) Foreign Application Priority Data

Aug. 23, 2000 (JP) ........................................ 2000-252105

(51) Int. Cl.[7] .......................................... H01L 21/8242
(52) U.S. Cl. ............................. 438/3; 438/240; 438/672
(58) Field of Search ................................ 438/253–256, 438/396–399, 3, 238–240, 672–677

(56) References Cited

U.S. PATENT DOCUMENTS 5,920,761 A * 7/1999 Jeon ............................ 438/240
6,239,022 B1 * 5/2001 Seo et al. .................... 438/629
6,277,731 B1 * 8/2001 Gonzalez et al. ........... 438/629

FOREIGN PATENT DOCUMENTS

JP  07-30077  1/1995

* cited by examiner

Primary Examiner—Jey Tsai
(74) Attorney, Agent, or Firm—Nixon Peabody LLP; Donald R. Studebaker

(57) ABSTRACT

A contact plug is formed in a contact hole, which has been formed through a passivation film on a substrate, so that a recess is left over the contact plug. Then, the passivation film is dry-etched so that the opening of the recess is expanded or that the depth of the recess is reduced. After that, lower electrode, which will be connected to the contact plug, capacitive insulating film of an insulating metal oxide and upper electrode are formed in this order to make a capacitor.

5 Claims, 7 Drawing Sheets substrate temperature during dry etching using Ar gas(°C)

METHOD FOR FABRICATING SEMICONDUCTOR MEMORY DEVICE HAVING A CAPACITOR

BACKGROUND OF THE INVENTION

The present invention relates to a semiconductor memory device including a capacitor that has a capacitive insulating film of an insulating metal oxide and also relates to a method for fabricating the device.

Recently, as digital technology has been developed, the performance of various electronic units has been further enhanced to catch up with a steep rise in the amount of data to be processed or stored at a time. As a result, semiconductor devices included in a semiconductor chip for those electronic units have been rapidly downsized. Correspondingly, to integrate a dynamic RAM (Random Access Memory) more densely, a technique of using a material with a high dielectric constant (which will be herein referred to as a "high-dielectric-constant material"), instead of silicon dioxide or silicon nitride widely used, for a capacitive insulating film has been broadly researched and developed. Further, to implement a novel nonvolatile RAM that can operate at a low operating voltage and write and read data at a high speed, a ferroelectric film with spontaneous polarization properties has been vigorously researched and developed.

To realize a highly densely integrated memory with a storage capacity of several megabits using this high-dielectric-constant or ferroelectric material, a stacked memory cell should be used instead of a know planar memory cell.

In this case, the most essential task in fabricating a stacked memory cell is to prevent the interface between a contact plug and the lower electrode of a capacitor from being oxidized during an annealing process performed in an oxygen ambient for crystallizing the high-dielectric-constant or ferroelectric material.

Hereinafter, a known semiconductor memory device will be described with reference to the drawings.

FIG. 6 is a cross-sectional view illustrating a main portion processed in one process step of a first known method for fabricating a semiconductor memory device.

As shown in FIG. 6, a gate electrode 102 is formed over a semiconductor substrate 100 with a gate insulating film 101 interposed therebetween. An insulating sidewall 103 is formed on side faces of the gate electrode 102. A doped layer 104 to be source/drain regions is defined in parts of the semiconductor substrate 100 below the gate electrode 102 to horizontally sandwich the gate electrode 102 therebetween. A transistor, including the gate electrode 102, doped layer 104, and so on, forms part of a semiconductor integrated circuit. And a passivation film 105 is deposited to cover the entire surface of the semiconductor substrate 100 including the semiconductor integrated circuit.

Further, as shown in FIG. 6, a contact hole 106 is formed in the passivation film 105 to reach the doped layer 104. A conductive contact plug 107 is formed in the contact hole 106. The contact plug 107 may be formed in the following manner. First, a conductor layers of polysilicon, tungsten, for example, is deposited over the entire surface of the semiconductor substrate 100 to fill in the contact hole 106. After that, the conductor layer is etched back by a dry etching or CMP (chemical/mechanical polishing) process to remove the excessive parts of the conductor layer outside of the contact hole 106. In this manner, the contact plug 107 can be formed out of the conductor layer in the contact hole 106. In this case, unless the conductor layer and the passivation film 105 are etched at the same rate, it is impossible to make the upper surface of the contact plug 107 flush with that of passivation film 105. However, in this etchback process, the etch rate of the material of the contact plug 107 is usually higher than that of the material of the passivation film 105. Thus, the upper surface of the contact plug 107 will be lower than that of the passivation film 105. As a result, a recess 108 having a wall standing vertically to the upper surface of the contact plug 107 is formed on the contact plug 107.

Furthermore, as shown in FIG. 6, a lower electrode 109 is formed on the passivation film 105, including the recess 108, and connected to the contact plug 107. The lower electrode 109 has a layered structure made up of: Ti layer; oxygen barrier layer of $IrO_2$, Ir, or $RuO_2$; and Pt layer that have been stacked in this order. A capacitive insulating film 110 made of an insulating metal oxide, e.g., high-dielectric-constant or ferroelectric material, is deposited on the lower electrode 109. An upper electrode 111 is formed on the capacitive insulating film 110. A capacitor 112 is made up of the lower electrode 109, capacitive insulating film 110, and upper electrode 111.

However, in the structure shown in FIG. 6, the recess 108 exists on the contact plug 107. In other words, a step 113 has been formed between the upper surfaces of the contact plug 107 and passivation film 105. As a result, the following problems occur. Specifically, if the lower electrode 109 is formed by a sputtering process, for example, on the passivation film 105 including the recess 108, the coverage of the lower electrode 109 will be poor due to the existence of the step 113, i.e., the lower electrode 109 including the oxygen barrier layer partly thins. Thus, the ability of the lower electrode 109 at forming a barrier against oxygen (which will be herein referred to as "oxygen blockability") deteriorates seriously. Accordingly, if an annealing process is performed in an oxygen ambient to crystallize the high-dielectric-constant or ferroelectric material that will be the capacitive insulating film 110 (which will be herein referred to as "annealing for crystallization"), oxygen reaches the surface of the contact plug 107 by way of the lower electrode 109. As a result, the contact plug 107 is oxidized to cause contact failure. Also, disconnection might also occur because of the partial decrease in thickness of the lower electrode 109.

In view of these problems, a countermeasure process, in which the wall of the recess is formed in a predetermined curved shape after the contact plug has been formed, was proposed in Japanese Laid-Open Publication No. 7-30077.

FIG. 7 is a cross-sectional view illustrating a main portion processed in one process step of a second known method for fabricating a semiconductor memory device as disclosed in Japanese Laid-Open Publication No. 7-30077. In FIG. 7, each member already shown in FIG. 6 is identified by the same reference numeral and the description thereof will be omitted herein.

In the second example, the contact plug 107 is formed as in the first example, and then the passivation film 105 is wet-etched with an etchant including hydrofluoric acid, for example, using a masking pattern (not shown) covering a predetermined region. In this manner, the wall of the recess 108 is formed in a predetermined curved shape as shown in FIG. 7. After that, the capacitor 112 is formed as in the first example.

However, the present inventors found that, it is also impossible in the second example to eliminate the above-mentioned problems completely, i.e., the contact plug 107 is oxidized during the annealing process for crystallizing the capacitive insulating film 110 to cause contact failures. That is to say, the wet etching process adopted for the second example disclosed in Japanese Laid-Open Publication No. 7-33077 is basically isotropic etching. Thus, as shown in FIG. 7, the passivation film 105 is wet-etched isotropically from the upper edge of the contact plug 107 as a start point. As a result, a first steep step 114 is unintentionally formed between the upper surface of the contact plug 107 and portion of the passivation film 105 near the contact plug 107. In addition, the closer to the upper edge of the passivation film 105, the closer to 90 degrees the angle formed by the recess wall with the upper surface of the passivation film 105. Thus, another second steep step 115 is unintentionally formed around the upper edge of the passivation film 105. Accordingly, in the second example, the coverage of the lower electrode 109 is also poor due to the existence of first or second step 114 or 115, and the lower electrode 109 partly thins. Thus, the oxygen blockability of the lower electrode 109 deteriorates. As a result, the contact plug 107 is oxidized during the annealing process for crystallizing the capacitive insulating film 110 to cause contact failures. Disconnection might occur as well because of the partial decrease in thickness of the lower electrode 109.

SUMMARY OF THE INVENTION

It is therefore an object of the present invention to prevent the contact plug from being oxidized and thereby eliminate contact failures resulting from the oxidation by suppressing the partial decrease in thickness of the lower electrode due to the existence of the step between the upper surfaces of the contact plug and passivation film.

To achieve this object, an inventive method for fabricating a semiconductor memory device includes the steps of: a) depositing a passivation film over a substrate in which source/drain regions have been defined for a transistor that forms part of a semiconductor integrated circuit; b) forming a contact hole through the passivation film so that the contact hole reaches one of the source/drain regions; c) forming a contact plug in the contact hole so that a recess is left over the contact plug; d) dry-etching the passivation film so that the recess has an expanded opening or a reduced depth; and e) forming a lower electrode connected to the contact plug, a capacitive insulating film of an insulating metal oxide and an upper electrode to make a capacitor. The lower electrode, the capacitive insulating film and the upper electrode are formed in this order on the dry-etched passivation film.

According to the inventive method, a contact plug is formed in a contact hole, which has been formed through a passivation film on a substrate, so that a recess is left over the contact plug. Then, the passivation film is dry-etched so that the opening of the recess is expanded or that the depth of the recess is reduced. Accordingly, it is possible to tilt the wall of the recess less steeply with respect to the upper surface of the contact plug or to reduce the height of a step formed between the upper surfaces of the passivation film and the contact plug (which will be herein referred to as an "on-plug step"). Thus, when a lower electrode for a capacitor is formed on the passivation film so as to be connected to the contact plug, it is possible to prevent the lower electrode from partially thinning. Consequently, if the lower electrode includes an oxygen barrier layer, the oxygen blockability of the lower electrode improves. Accordingly, even if an annealing process is performed in an oxygen ambient to crystalline an insulating metal oxide (i.e., a high-dielectric-constant or ferroelectric material) for a capacitive insulating film, no oxygen diffuses toward and reaches the contact plug by way of the lower electrode. As a result, the contact plug is not oxidized, and no contact failures will occur.

In one embodiment of the present invention, the step d) may be performed using an Ar gas.

Then, a physical etching can be performed by controlling the direction in which Ar ions are implanted. Thus, only those portions of the passivation film near the recess can be etched as intended. Accordingly, the wall of the recess can have a desired tilt angle or desired depth. In other words, the recess can be formed in a desired shape. Thus, it is possible to suppress the partial decrease in thickness of the lower electrode due to the existence of the on-plug step. As a result, the oxygen blockability of the lower electrode, including the oxygen barrier layer, should improve as intended.

In another embodiment, the step d) may be performed with the substrate heated to a temperature between 100° C. and 700° C., both inclusive.

Then, the recess can be formed in a desired shape. Thus, it is possible to suppress the partial decrease in thickness of the lower electrode due to the existence of the on-plug step. As a result, the oxygen blockability of the lower electrode, including the oxygen barrier layer, should improve as intended.

In still another embodiment, the step d) may include setting a tilt angle, formed by a wall of the recess with the upper surface of the contact plug, at 70 degrees or less.

Then, it is possible to suppress the partial decrease in thickness of the lower electrode due to the existence of the on-plug step. As a result, the oxygen blockability of the lower electrode, including the oxygen barrier layer, should improve as intended.

In yet another embodiment, the step d) may include setting the depth of the recess at 50 nm or less.

Then, it is possible to suppress the partial decrease in thickness of the lower electrode due to the existence of the on-plug step. As a result, the oxygen blockability of the lower electrode, including the oxygen barrier layer, should improve as intended.

A first inventive semiconductor memory device includes: a passivation film formed over a substrate in which source/drain regions have been defined for a transistor that forms part of a semiconductor integrated circuit; a contact hole, which has been formed through the passivation film to reach one of the source/drain regions; a contact plug, which has been formed in the contact hole so that a recess is left over the contact plug; a lower electrode for a capacitor, the lower electrode having been formed on the passivation film and connected to the contact plug; a capacitive insulating film formed on the lower electrode out of an insulating metal oxide; and an upper electrode for the capacitor, the upper electrode having been formed on the capacitive insulating film. In this device, a tilt angle formed by a wall of the recess with the upper surface of the contact plug is 70 degrees or less.

In the first inventive device, a contact plug is formed in a contact hole, which has been formed through a passivation film on a substrate, so that a recess is left over the contact plug. And a tilt angle formed by the wall of the recess with the upper surface of the contact plug is 70 degrees or less. Thus, when a lower electrode for a capacitor is formed on the passivation film so as to be connected to the contact plug, it is possible to prevent the lower electrode from partially thinning due to the existence of an on-plug step. Consequently, if the lower electrode includes an oxygen barrier layer, the oxygen blockability of the lower electrode improves. Accordingly, even if an annealing process is performed in an oxygen ambient to crystalline a high-dielectric-constant or ferroelectric material for a capacitive insulating film, no oxygen diffuses toward and reaches the contact plug by way of the lower electrode. As a result, the contact plug is not oxidized, and no contact failures will occur.

A second inventive semiconductor memory device includes: a passivation film formed over a substrate in which source/drain regions have been defined for a transistor that forms part of a semiconductor integrated circuit; a contact hole, which has been formed through the passivation film to reach one of the source/drain regions; a contact plug, which has been formed in the contact hole so that a recess is left over the contact plug; a lower electrode for a capacitor, the lower electrode having been formed on the passivation film and connected to the contact plug; a capacitive insulating film formed on the lower electrode out of an insulating metal oxide; and an upper electrode for the capacitor, the upper electrode having been formed on the capacitive insulating film. In this device, the recess has a depth of 50 nm or less.

In the second inventive device, a contact plug is formed in a contact hole, which has been formed through a passivation film on a substrate, so that a recess is left over the contact plug. And the recess has a depth of 50 nm or less. Thus, when a lower electrode for a capacitor is formed on the passivation film so as to be connected to the contact plug, it is possible to prevent the lower electrode from partially thinning due to the existence of an on-plug step. Consequently, if the lower electrode includes an oxygen barrier layer, the oxygen blockability of the lower electrode improves. Accordingly, even if an annealing process is performed in an oxygen ambient to crystalline a high-dielectric-constant or ferroelectric material for a capacitive insulating film, no oxygen diffuses toward and reaches the contact plug by way of the lower electrode. As a result, the contact plug is not oxidized, and no contact failures will occur.

DESCRIPTION OF THE PREFERRED EMBODIMENTS

Hereinafter, a semiconductor memory device and a method for fabricating the device in accordance with an embodiment of the present invention will be described with reference to the drawings.

FIGS. 1A through 1E are cross-sectional views showing respective process steps for fabricating a semiconductor memory device according to an embodiment of the present invention.

Figure 1A:
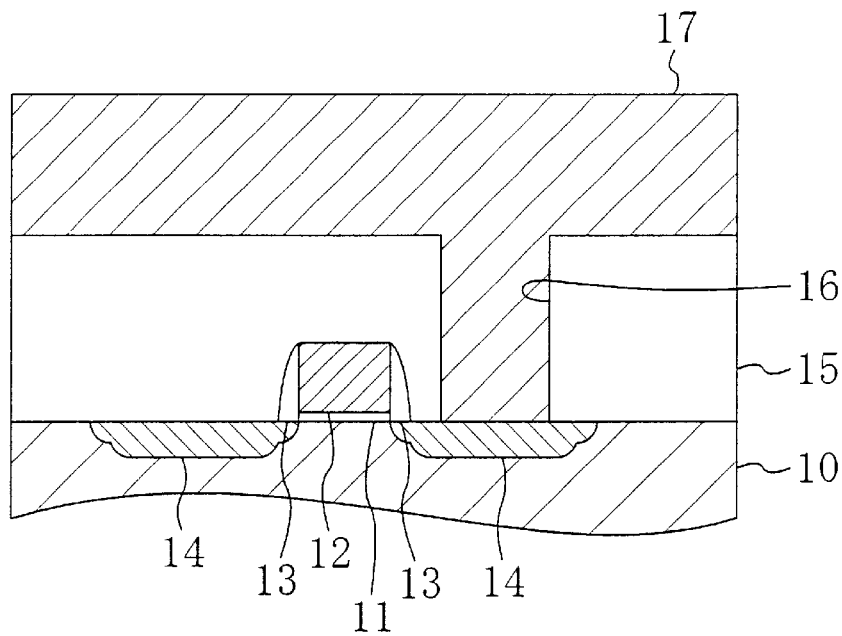
FIGS. 1A through 1E are cross-sectional views showing respective process steps for fabricating a semiconductor memory device according to an embodiment of the present invention.

First, as shown in FIG. 1A, a gate electrode 12 is formed over a semiconductor substrate 10 with a gate insulating film 11 interposed therebetween. Then, an insulating sidewall 13 is formed on the side faces of the gate electrode 12. After that, a doped layer 14 to be source/drain regions is defined in parts of the semiconductor substrate 10 below the gate electrode 12 to horizontally sandwich the gate electrode 12 therebetween. Subsequently, a passivation film 15 containing silicon dioxide, for example, is deposited to a thickness between about 600 nm and about 1 $\mu$m, for example, over the entire surface of the semiconductor substrate 10 as well as a semiconductor integrated circuit. The circuit includes the transistor made up of the gate electrode 12, doped layer 14, and so on. Then, the passivation film 15 is dry-etched to form a contact hole 16 reaching the doped layer 14. Thereafter, a conductor layer 17 of tungsten or polysilicon doped with phosphorus, for example, is deposited by a CVD (chemical vapor deposition) process over the entire surface of the semiconductor substrate 10. In this manner, the contact hole 16 is completely filled in with the conductor layer 17. In this case, to fill in the contact hole 16 with the conductor layer 17 completely, the thickness of the conductor layer 17 should be about 1.5–2.0 time as large as the diameter of the contact hole 16, or even more.

Figure 1B:
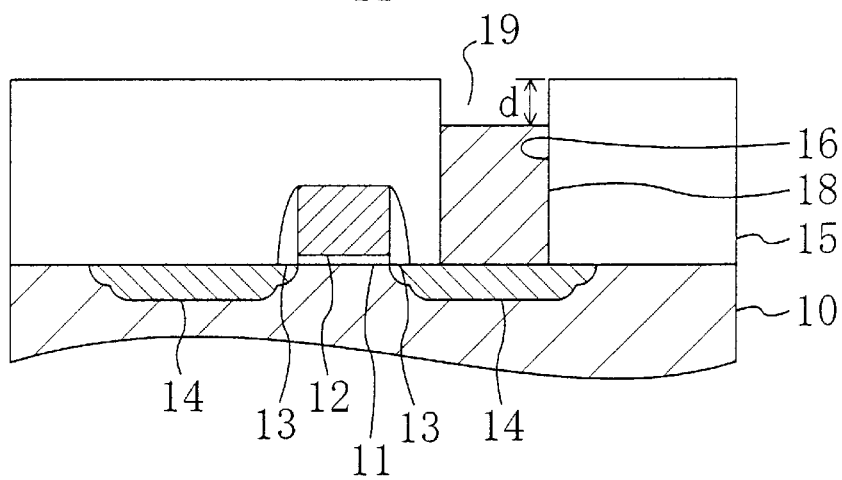

Next, as shown in FIG. 1B, the conductor layer 17 is etched back by a dry etching or CMP process to such a depth as exposing the passivation film 15, thereby removing the excessive parts of the conductor layer 17 outside of the contact hole 16. In this manner, a contact plug 18 is formed out of the conductor layer 17 in the contact hole 16. In this case, to remove the residue of the conductor layer 17 resulting from the etchback process completely, the conductor layer 17 needs to be over-etched for a period of time about 20% through 30% longer than the normally required one. Generally speaking, if the conductor layer 17 is made of tungsten or polysilicon doped with phosphorus, for example, and if the passivation film 15 is made of silicon dioxide, then the etch rate of the conductor layer 17 is about ten or more times as high as that of the underlying passivation film 15 during the etchback process. Thus, when the over-etching process is performed under the condition, the conductor layer 17 is etched deep enough, while the passivation film 15 is hardly etched. As a result, the upper surface of the contact plug 18 will be lower than that of the passivation film 15, and a recess 19 (with a depth d) is formed over the contact plug 18. At this time, the recess 19 has a wall standing almost vertically to the upper surface of the contact plug 18.

Figure 1C:
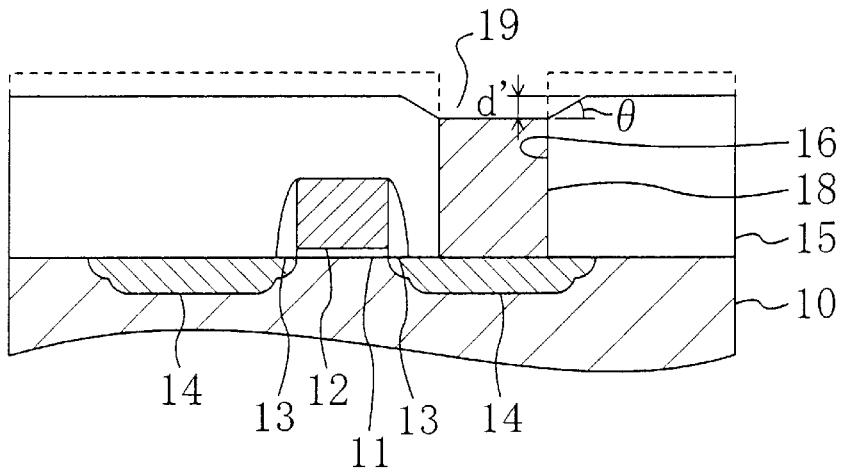

Then, as shown in FIG. 1C, the passivation film 15 is dry-etched using an Ar gas to decrease the depth of the recess 19 and to expand the opening of the recess 19. Specifically, the dry etching process is performed so that a tilt angle θ formed by the wall of the recess 19 with the upper surface of the contact plug 18 will be less than 90 degrees and that the recess 19 will have a depth d' smaller than the depth d. In this case, the dry etching process may be performed under the following conditions: the flow rate of the Ar gas is set to 50 sccm; the pressure of the Ar gas is set to 4 Pa; the RF (radio frequency) power is set to 400 W; and the temperature of the substrate (specifically, the temperature of a stage on which a wafer including the substrate 10 is been placed) is set to 400° C. In FIG. 1C, the outline of the passivation film 15, not subjected to the dry etching process yet, is indicated by the broken lines.

Figure 1D:
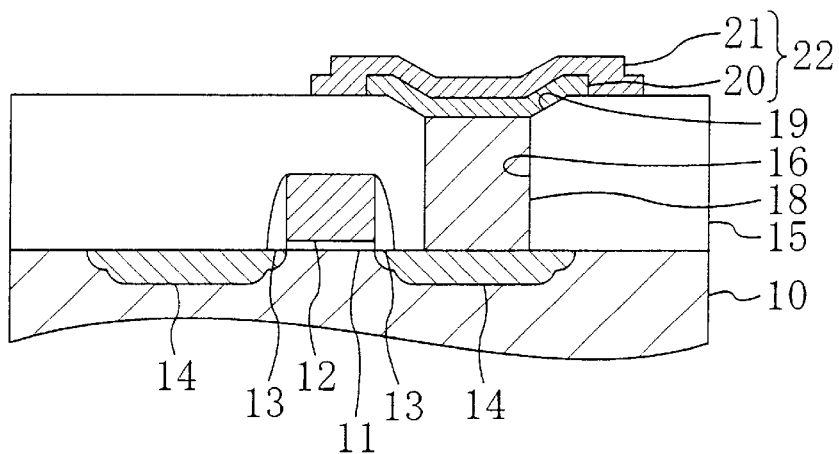

Then, as shown in FIG. 1D, a stack of Ti and TiAlN films, for example, is deposited by a sputtering process in this order over the contact plug 18 and passivation film 15. Then, the stack is patterned by a dry etching process to cover the contact plug 18. In this manner, a first oxygen barrier film 20 is formed. After that, a stack of Ir, $IrO_2$, and Pt films, for example, is deposited by a sputtering process in this order over the first oxygen barrier film 20 and passivation film 15. Then, the stack is patterned by a dry etching process to cover the upper and side faces of the first oxygen barrier film 20 completely. In this manner, a second oxygen barrier film 21 is formed. As a result, a lower electrode 22 is formed out of the double barrier layers, i.e., the first and second oxygen barrier films 20 and 21. In this case, the thicknesses of the TiAlN and Ti films making up the first oxygen barrier film 20 may be 40 nm and 20 nm, respectively. And the thicknesses of the Pt, $IrO_2$, and Ir films making up the second oxygen barrier film 21 may be 50 nm, 150 nm, and 100 nm, respectively.

Figure 1E:
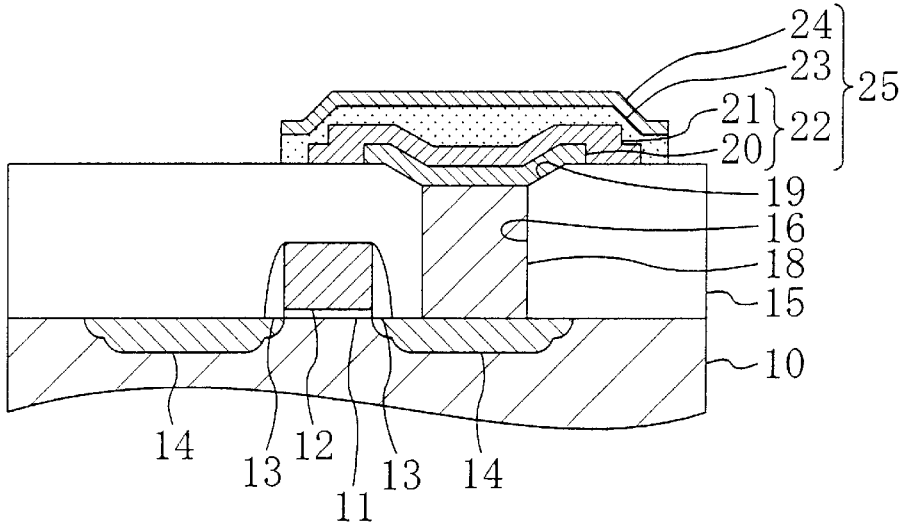

Thereafter, as shown in FIG. 1E, a capacitive insulating film 23 is deposited over the lower electrode 22 and passivation film 15 as a thin film of an insulating metal oxide, e.g., $SrBi_2(Ta_{1-x}Nb_x)O_9$ (where $0 \leq x \leq 1$) having a bismuth layered perovskite structure, by such a process as MOD (metal organic decomposition), MOCVD (metalorganic chemical vapor deposition) or sputtering. After that, an upper electrode 24 is formed by a sputtering process over the capacitive insulating film 23. The upper electrode 24 may have a layered structure made up of a Pt film and a Ti or TiN film that have been stacked in this order. Subsequently, the capacitive insulating film 23 and upper electrode 24 are patterned by a dry etching process to cover the lower electrode 22. In this manner, a capacitor 25 for storing data therein is formed out of the lower electrode 22, capacitive insulating film 23, and upper electrode 24. In this case, the thickness of the capacitive insulating film 23 may be between about 150 nm and about 250 nm. And the thicknesses of the Ti (or TiN) and Pt films for the upper electrode 24 may be 20 nm and 50 nm, respectively.

As described above, according to this embodiment, a contact plug 18 is formed in a contact hole 16, which has been formed through a passivation film 15 on a substrate 10, to leave a recess 19 over the plug 18. Then, the passivation film 15 is dry-etched to expand the opening of the recess 19 and to reduce the depth of the recess 19. Accordingly, it is possible to tilt the wall of the recess 19 less steeply with respect to the upper surface of the contact plug 18 or to reduce the height of a step formed between the upper surface of the passivation film 15 and that of the contact plug 18 (which will be herein referred to as a "on-plug step"). Thus, when a lower electrode 22 for a capacitor, connected to the contact plug 18, is formed on the passivation film 15, it is possible to prevent the lower electrode 22 from partially thinning. Consequently, the oxygen blockability of the lower electrode 22 including the oxygen barrier layer (i.e., the first and second oxygen barrier films 20 and 21) improves. Accordingly, even if an annealing process is performed in an oxygen ambient to crystallize the insulating metal oxide (i.e., a high-dielectric-constant or ferroelectric material) to be the capacitive insulating film 23, no oxygen diffuses toward and reaches the contact plug 18 by way of the lower electrode 22. As a result, the contact plug 18 is not oxidized, and no contact failure will occur.

Further, according to this embodiment, an Ar gas is used as an etching gas for dry-etching the passivation film 15. Thus, a physical etching can be performed by controlling the direction in which Ar ions are implanted. Thus, only those portions of the passivation film 15 near the recess 19 can be etched as intended. Accordingly, the wall of the recess 19 can have a desired tilt angle or desired depth. In other words, the recess 19 can be formed in a desired shape. Thus, it is possible to suppress the partial decrease in thickness of the lower electrode 22 due to the existence of the on-plug step. As a result, the oxygen blockability of the lower electrode 22, including the first and second oxygen barrier films 20 and 21, should improve.

Figure 2:
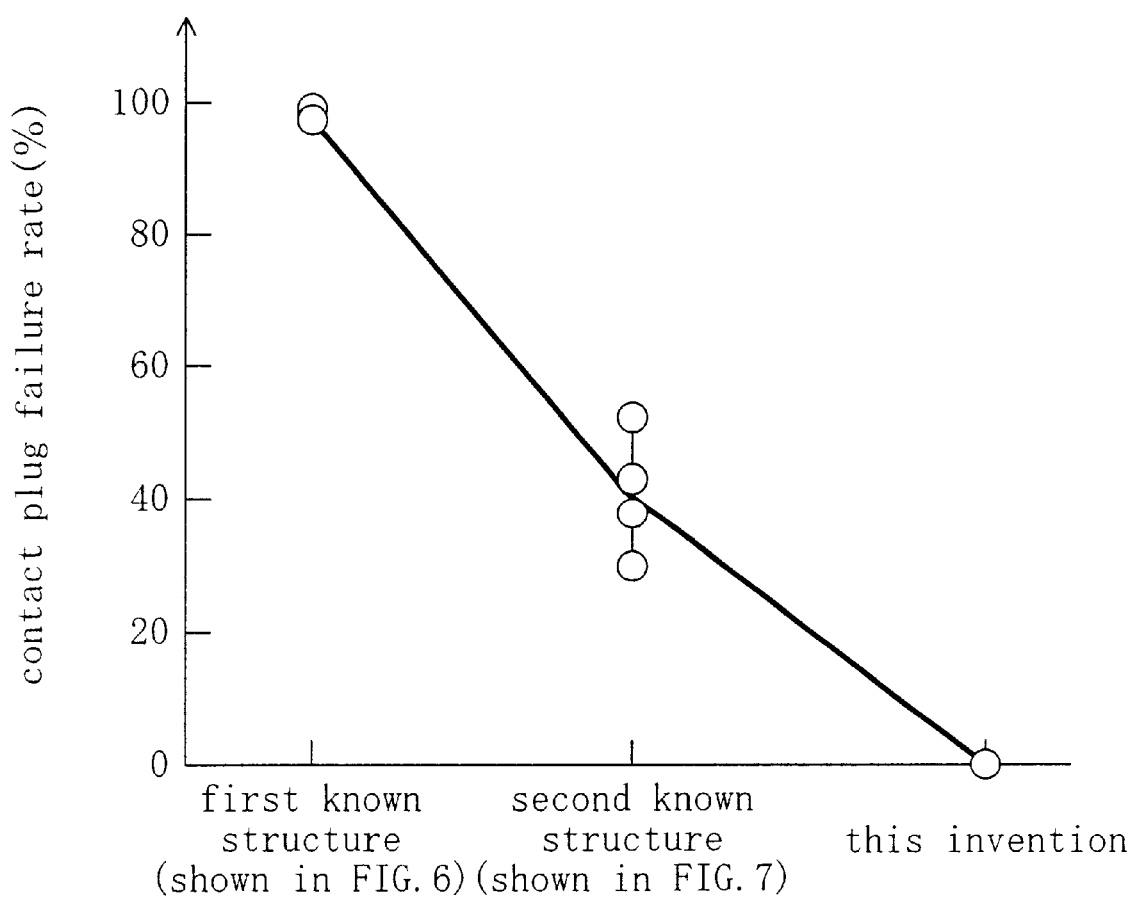
FIGS. 2 is a graph showing, in comparison, respective rates of failures that occurred at contact plugs formed in accordance with first and second known methods and an inventive method for fabricating semiconductor memory devices.

FIG. 2 shows, in comparison, respective rates of failures occurring at contact plugs formed in accordance with the first and second known methods and the inventive method for fabricating semiconductor memory devices. In FIG. 2, the rate of failures occurring at the contact plugs is represented as a ratio of the number of contact plugs that showed resistances exceeding a predetermined value (e.g., 1 kΩ) to the total number of contact plugs under the following situation. Specifically, multiple contact plugs with a diameter of 0.7 μm were formed on respective parts of a wafer to be substrates. Then, lower electrodes for capacitors were formed. After that, an annealing process was performed at a temperature of 650° C. for three hours in an oxygen ambient to crystallize a ferroelectric material for a capacitive insulating film.

Figure 6:
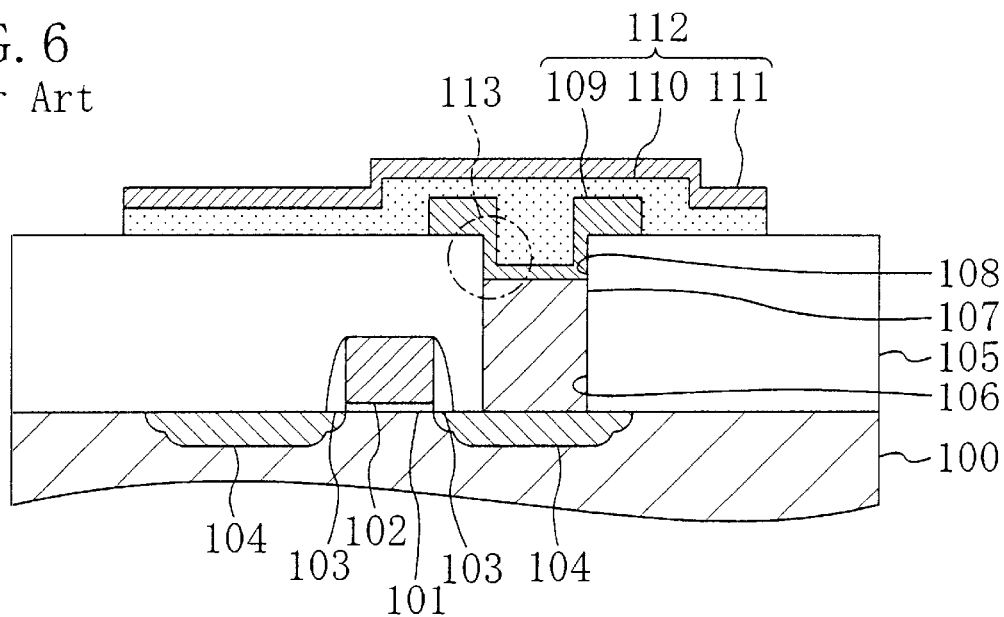
FIG. 6 is a cross-sectional view illustrating a main portion processed in one process step of the first known method for fabricating a semiconductor memory device.
Figure 7:
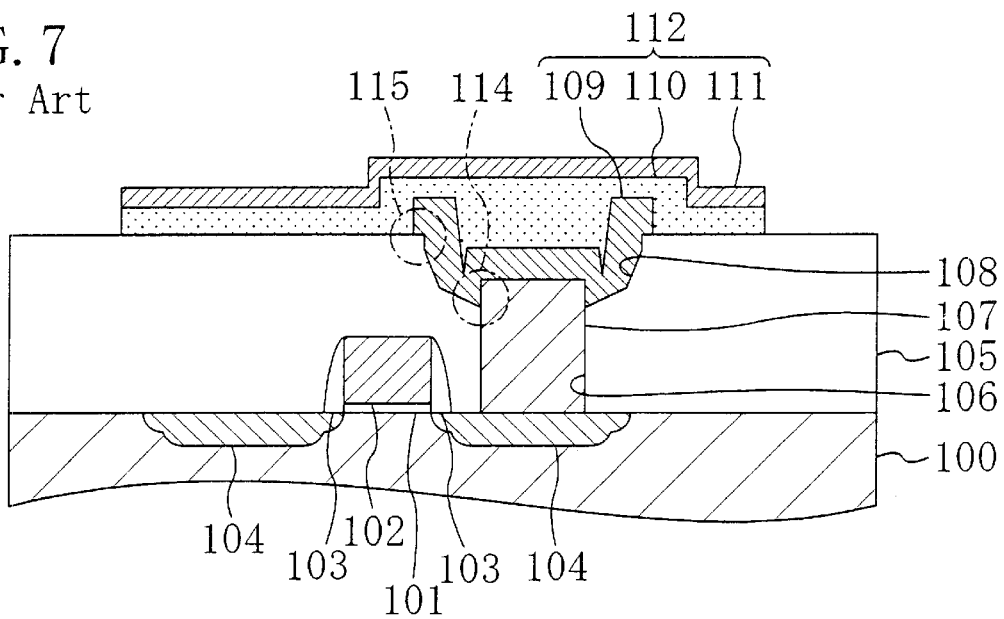
FIG. 7 is a cross-sectional view illustrating a main portion processed in one process step of the second known method for fabricating a semiconductor memory device.

In the first known method (see FIG. 6), the rate of failures occurring at the contact plugs is approximately 100% as shown in FIG. 2. In the second known method (see FIG. 7) on the other hand, the rate of failures occurring at the contact plugs is approximately 40%. Specifically, the second known method relates to a situation where the passivation film was wet-etched with an etchant including hydrofluoric acid after the contact plugs had been formed. In contrast, according to this embodiment, the rate of failures occurring at the contact plugs is 0%. Specifically, this embodiment relates to a situation where the passivation film was dry-etched using an Ar gas after the contact plugs had been formed. Thus, this embodiment is much more effective in eliminating the contact failures. That is to say, the present invention improves characteristics of the semiconductor memory device remarkably.

Figure 3:
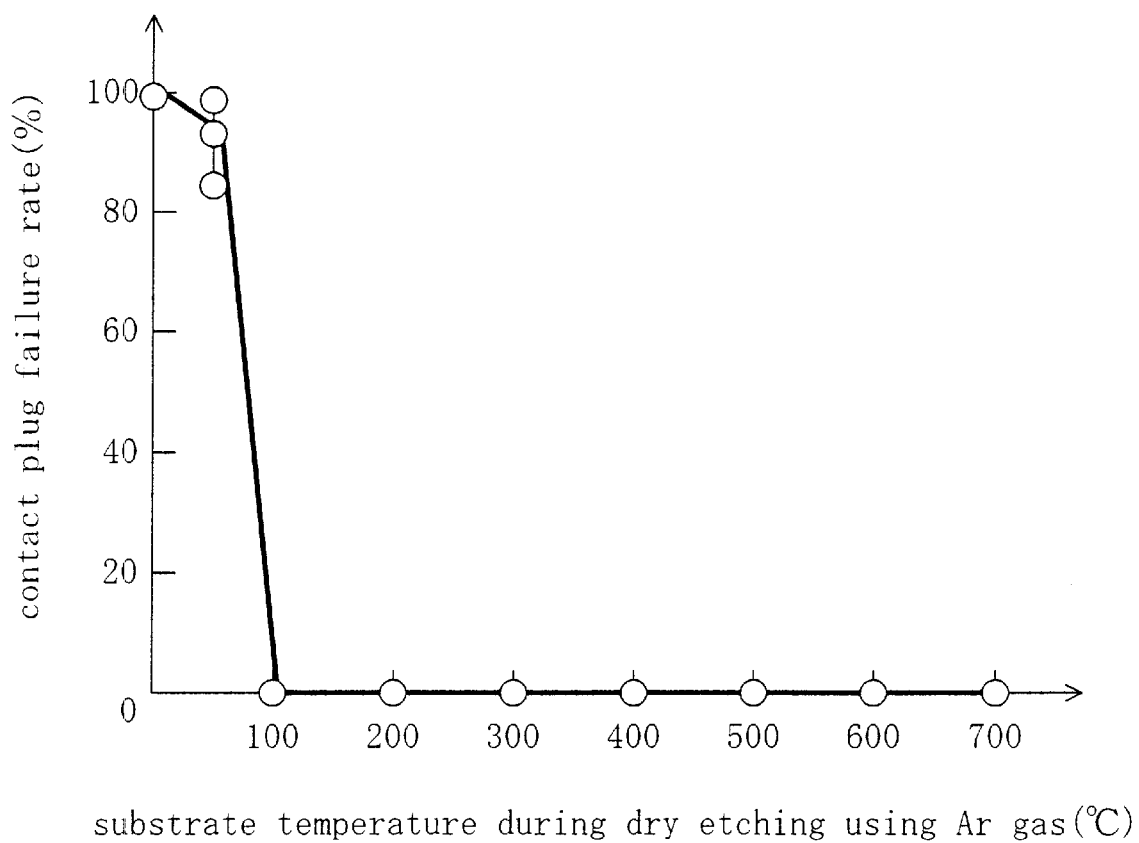
FIG. 3 is a graph showing a relationship between the substrate temperature and the rate of failures that occurred at the contact plugs in the inventive process where a dry etching process was performed using an Ar gas after the contact plugs had been formed.

FIG. 3 shows a relationship between the substrate temperature and the rate of failures occurring at the contact plugs 18 in the inventive process where the dry etching process was performed using an Ar gas after the contact plugs 18 had been formed. In FIG. 3, the rate of failures occurring at the contact plugs 18 was obtained as in FIG. 2.

As shown in FIG. 3, in this embodiment, if the temperature of the substrate was 100° C. or higher during the dry etching process using the Ar gas, the rate of failures occurring at the contact plugs 18 was 0%. It should be noted that no data could be obtained at temperatures of 700° C. or higher because of the limited ability of the dry etching system. That is to say, in this embodiment, the temperature of the substrate is preferably from 100° C. through 700° C. during the dry etching process using the Ar gas.

Figure 4:
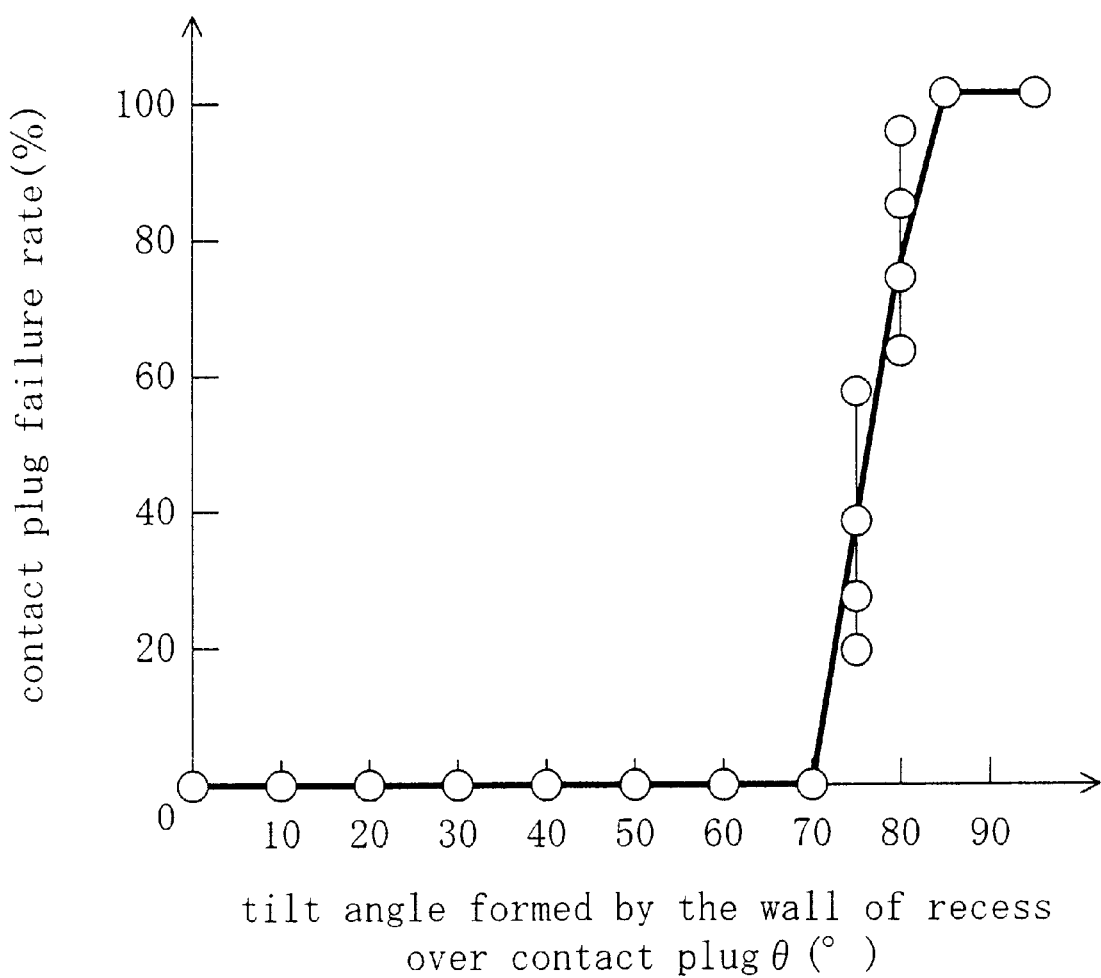
FIG. 4 is a graph showing a relationship between the tilt angle that was formed by the wall of the recesses over the contact plugs and the rate of failures that occurred at the contact plugs after the dry etching process had been performed using the Ar gas by the method of this embodiment.

FIG. 4 shows a relationship between the tilt angle θ (see FIG. 1C) that was formed by the wall of the recess 19 and the rate of failures that occurred at the contact plugs 18 after the dry etching process had been performed using the Ar gas by the method of this embodiment. In FIG. 4, the rate of failures occurring at the contact plug 18 was also obtained as in FIG. 2.

As shown in FIG. 4, in this embodiment, when the tilt angle θ formed by the wall of the recess 19 was 70 degrees or less, the rate of failures occurring at the contact plugs 18 was 0%. That is to say, the wall of the recess 19 preferably forms a tilt angle θ of 70 degrees or less with the upper surface of the contact plug 18 in the semiconductor memory device of this embodiment. As described above, this device includes: the passivation film 15 deposited over the substrate 10, on which a semiconductor integrated circuit has been formed; the contact plug 18 filling the contact hole 16 formed through the passivation film 15 to leave the recess 19 over the plug 18; and the capacitor 25 as a stack of the lower electrode 22, capacitive insulating film 23 and upper electrode 24.

Figure 5:
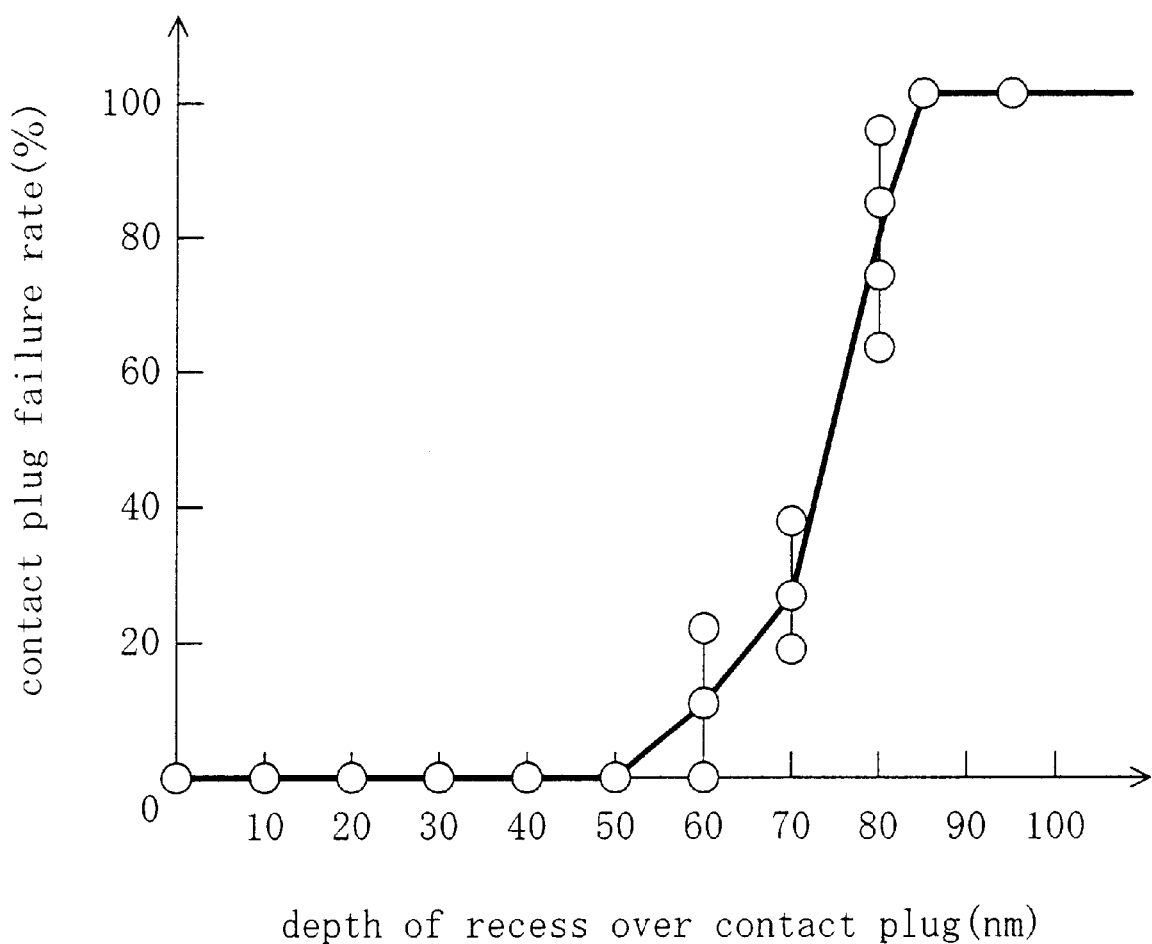
FIG. 5 is a graph showing a relationship between the depth of the recesses over the contact plugs and the rate of failures that occurred at the contact plugs after the dry etching process had been performed using the Ar gas by the method of this embodiment.

FIG. 5 shows a relationship between the depth d' of the recess 19 (see FIG. 1C) and the rate of failures occurring at the contact plugs 18 after the dry etching process had been performed using the Ar gas by the method of this embodiment. In FIG. 5, the rate of failures occurring at the contact plugs 18 was also obtained as in FIG. 2. The results obtained on the supposition that the wall of the recess 19 should form a tilt angle θ of about 45 degrees irrespective of the depth of the recess 19.

In this embodiment, when the depth of the recess 19 was 50 nm or less, the rate of failures occurring at the contact plugs 18 was 0% as shown in FIG. 5. That is to say, in the semiconductor memory device of this embodiment, the depth of the recess 19, i.e., the height of the on-plug step, is preferably 50 nm or less.

In the foregoing embodiment, $SrBi_2(Ta_{1-x}Nb_x)O_9$ is used as a material for the capacitive insulating film 23. Alternatively, any other ferroelectric material having a bismuth layered perovskite structure, lead zirconate titanate, strontium barium titanate or tantalum pentoxide may be used instead.

Further, in the foregoing embodiment, the Ar gas is used when the passivation film 15 is dry-etched after the contact plug 18 has been formed. But any other etching gas may be used instead. Also, the surface of the passivation film 15 does not have to be dry-etched entirely. This is because the above-described effects can be obtained so long as at least the portion of the passivation film 15 near the recess 19 is dry-etched to expand the opening of the recess 19 or to decrease the depth of the recess 19. Furthermore, this dry-etching process may also be performed so that the recess 19 disappears, i.e., so that the wall of the recess 19 forms a tilt angle θ of zero degrees and that the recess 19 has a depth d' of zero.

What is claimed is:

1. A method for fabricating a semiconductor memory device, the method comprising the steps of:

a) depositing a passivation film over a substrate in which source/drain regions have been defined for a transistor that forms part of a semiconductor integrated circuit;

b) forming a contact hole through the passivation film so that the contact hole reaches one of the source/drain regions;

c) forming a contact plug in the contact hole so that a recess is left over the contact plug;

d) dry-etching only the passivation film so that a tilt angle formed by the wall of the recess with the upper surface of the contact plug is less than 90 degrees; and e) forming a lower electrode connected to the contact plug, a capacitive insulating film of an insulating metal oxide and an upper electrode to make a capacitor, the lower electrode, the capacitive insulating film and the upper electrode being formed in this order on the dry-etched passivation film.

2. The method of claim 1, wherein the step d) is performed using an Ar gas.

3. The method of claim 1, wherein the step d) is performed with the substrate heated to a temperature between 100° C. and 700° C., both inclusive.

4. The method of claim 1, wherein the step d) comprises setting a tilt angle, formed by a wall of the recess with the upper surface of the contact plug, at 70 degrees or less.

5. The method of claim 1, wherein the step d) comprises setting the depth of the recess at 50 nm or less.

* * * * *